United States Patent [19]

Kuhara et al.

[11] Patent Number: 5,043,665
[45] Date of Patent: Aug. 27, 1991

[54] MAGNETIC RESONANCE IMAGING SYSTEM

[75] Inventors: Shigehide Kuhara; Kozo Satoh, both of Yokohama, Japan

[73] Assignee: Kabushiki Kaisha Toshiba, Kawasaki, Japan

[21] Appl. No.: 442,626

[22] Filed: Nov. 29, 1989

[30] Foreign Application Priority Data

Nov. 30, 1988 [JP] Japan .............................. 63-302468

[51] Int. Cl.$^5$ .......................................... G01R 33/20
[52] U.S. Cl. .................................................. 324/309
[58] Field of Search ............... 324/307, 309, 311, 312, 324/314

[56] References Cited

U.S. PATENT DOCUMENTS

| | | | |
|---|---|---|---|
| 4,165,479 | 8/1979 | Mansfield | 324/309 |
| 4,451,788 | 5/1984 | Edelstein et al. | 324/309 |
| 4,746,864 | 5/1988 | Satoh | 324/309 |
| 4,767,991 | 8/1988 | Rzedzian | 324/312 |
| 4,780,675 | 10/1988 | De Meester et al. | 324/312 |
| 4,794,337 | 12/1988 | Twieg | 324/312 |
| 4,859,946 | 8/1989 | Kuhara | 324/309 |

FOREIGN PATENT DOCUMENTS 0280310 8/1988 European Pat. Off. .
0325461 7/1989 European Pat. Off. .

OTHER PUBLICATIONS

"Snapshot Head Imaging at 0.5 T Using the Echo Planar Technique", Magnetic Resonance in Medicine, vol. 8, No. 1, Sep. 1988, pp. 110–115, Duluth, Minn., U.S.; R. J. Ordidge et al.

"Faster MR Imaging Methods", SPIE, Medical Image Processing, vol. 593, 1985, pp. 6–13, P. Margosian et al.

Primary Examiner—Michael J. Tokar
Attorney, Agent, or Firm—Oblon, Spivak, McClelland, Maier & Neustadt

[57] ABSTRACT

A magnetic resonance imaging system collects all the data required for image reconstruction of a predetermined portion of an object under examination by one excitation process in accordance with a pulse sequence in which, after excitation of spins within the predetermined portion by a radio frequency magnetic field and a gradient magnetic field, a predetermined readout gradient magnetic field is applied switched positive and negative at high speed to produce multiechoes on both sides of a spin echo center and a predetermined phase encoding gradient magnetic field is applied whose amount and sequence in encode steps are controlled so that multiecho data or its complex conjugate data may scan substantially the half of a Fourier data plane. By taking the complex conjugate of the magnetic resonance data collected in that way and then two-dimensional Fourier transforming the magnetic resonance data and the complex conjugate data, a magnetic resonance image of the predetermined portion of the object is obtained.

12 Claims, 7 Drawing Sheets

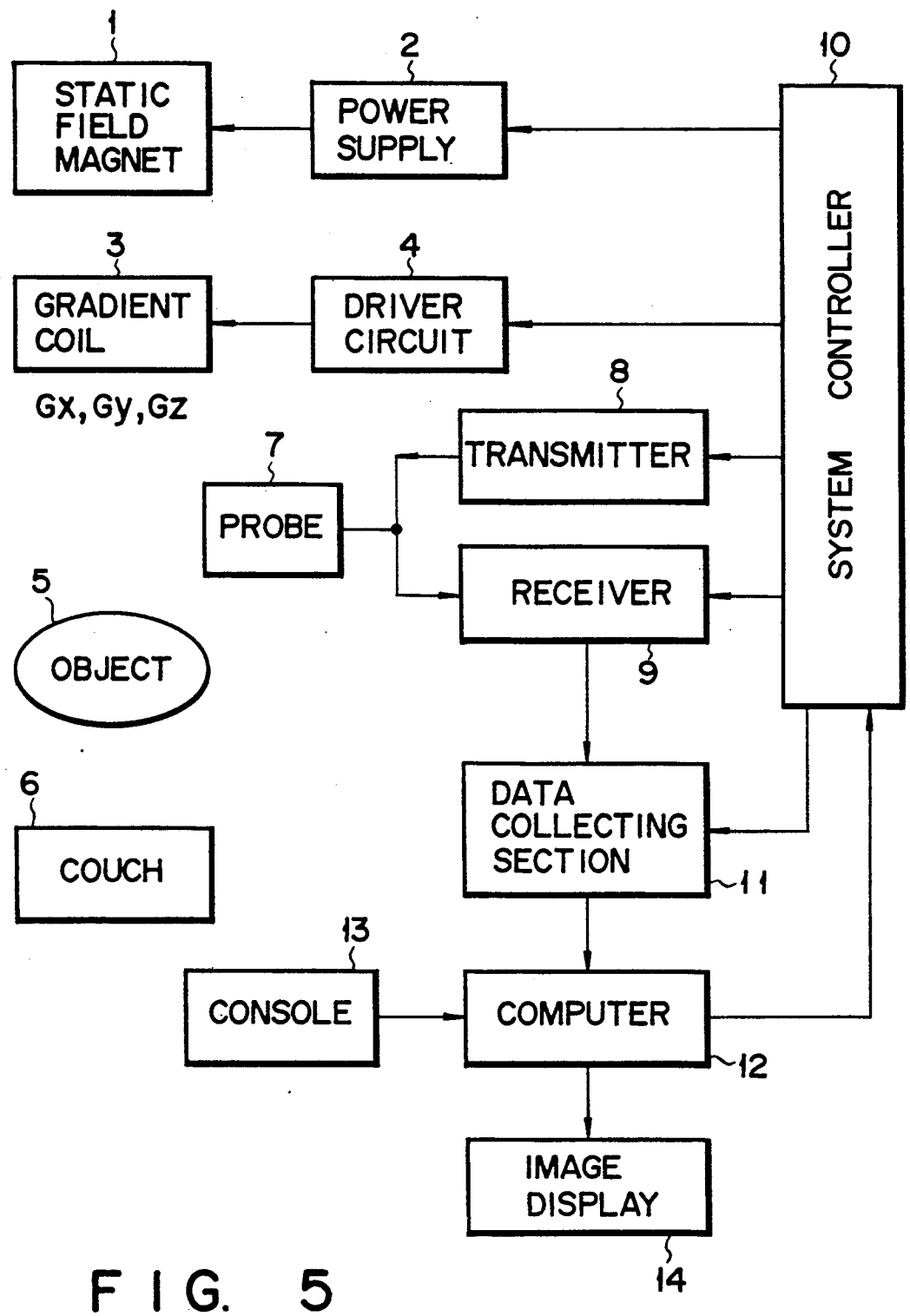
F I G. 5

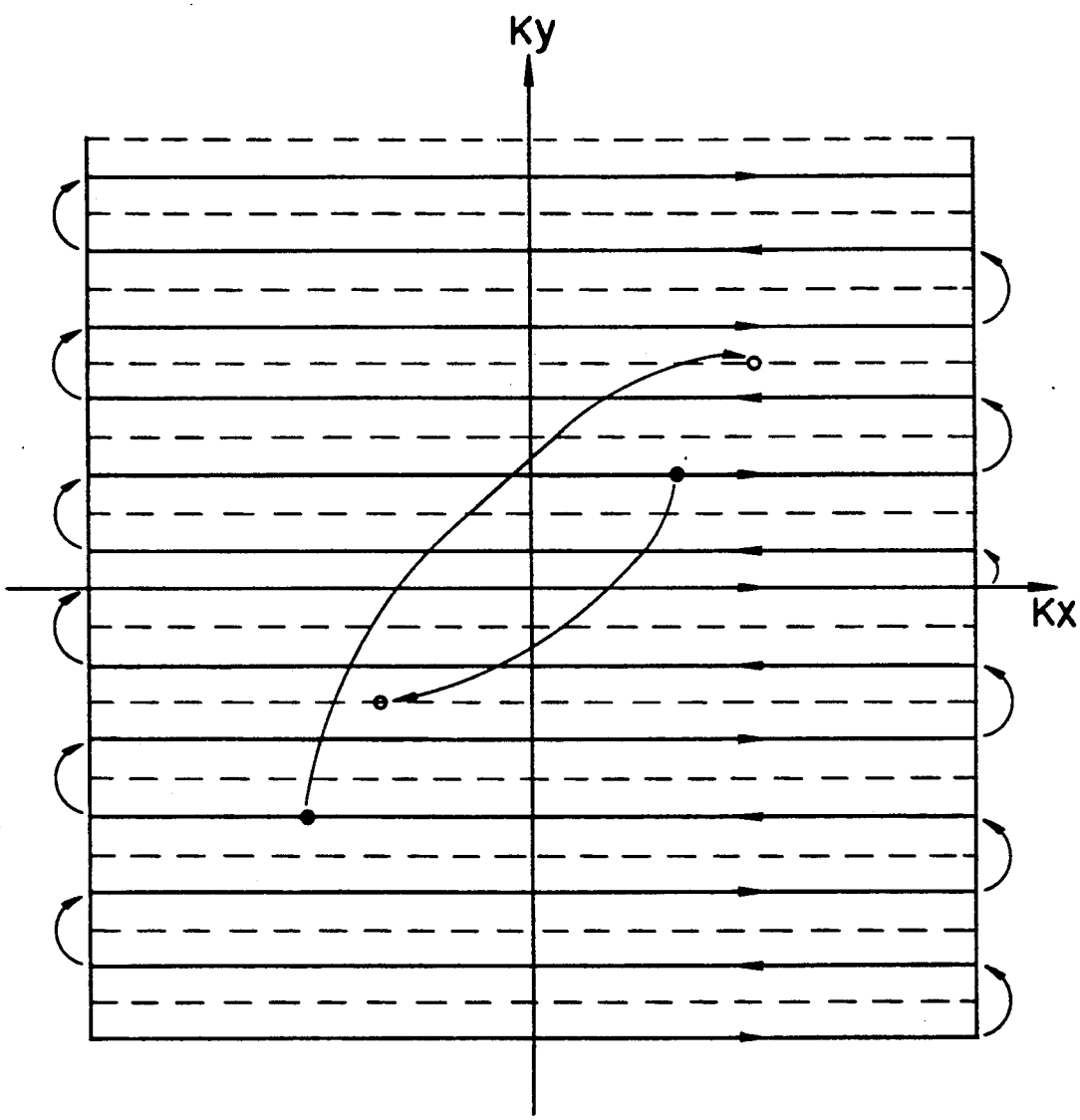
F I G. 7

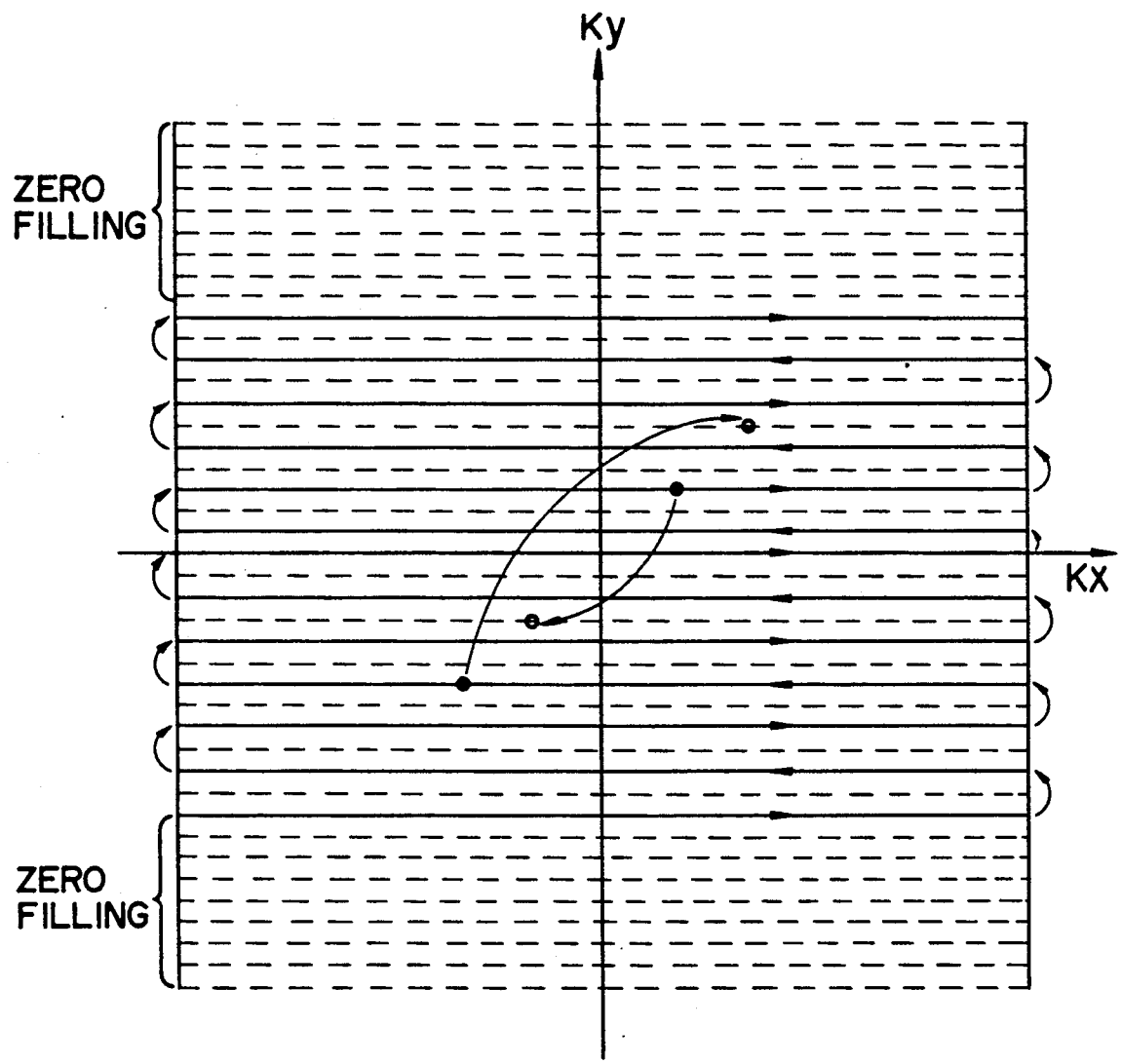
F I G. 10

MAGNETIC RESONANCE IMAGING SYSTEM

BACKGROUND OF THE INVENTION

1. Field of the Invention

The present invention relates to a magnetic resonance imaging system and, more particularly, to a magnetic resonance imaging system which permits acquisition of a magnetic resonance image of an object under examination.

2. Description of the Related Art

As is well known, magnetic resonance imaging (MRI) is a method of imaging chemical and physical information of molecules utilizing a magnetic resonance phenomenon in which, when placed in a uniform static magnetic field of an intensity of Ho, nuclear spins having an intrinsic magnetic moment absorb the energy of a radio-frequency magnetic field rotating at a specific angular velocity $\omega = \gamma$ Ho ($\gamma$=gyromagnetic ratio) in a plane orthogonal to the direction of the static magnetic field.

Methods of imaging spatial distribution of specific nuclei (for example, hydrogen atomic nuclei, i.e., proton, within water or fat) within an object under examination using the magnetic resonance imaging technique include the projection reconstruction method by Lauterbur, the Fourier method by Kumar, Welti or Ernst, the spin warp method by Hutchison which is a modification of the Fourier method and so on.

With magnetic resonance imaging systems for obtaining images by the use of the magnetic resonance imaging, it takes a long time to acquire data as compared with other medical image diagnostic apparatuses such as ultrasonic diagnostic apparatus and X-ray computed tomography apparatus. Hence, artifacts may be produced by movement of an object under examination such as physiological motion due to respiration. A problem thus arises in that imaging of parts of the object which move rapidly, such as his or her heart and blood will cause the subject a great deal of pain.

As methods of obtaining images at high speed by the magnetic resonance imaging, therefore, ultra high speed imaging methods have been proposed which include the echo planar method by Mansfield and the ultra high speed Fourier method by Hutchison.

With the ultra high speed Fourier method, magnetic resonance data are acquired in accordance with such a pulse sequence as shown in FIG. 1.

(1) A 90° radio frequency selective excitation pulse adapted to create a radio frequency field RF is applied to a selected slice of the body of an object under examination subjected to a gradient field Gs for slice selection to selectively excite spins within the slice.

(2) A 180° radio frequency pulse is applied to the slice for the excitation of a spin echo.

(3) With a readout gradient field Gr applied in the direction parallel to the slice plane while being switched in polarity a plural number of times at high speed, a phase-encoding gradient field Ge is applied, in the direction which is parallel to the slice plane an orthogonal to the readout gradient field Gr, to the slice in a predetermined polarity before the repeated switching of the polarity of the readout gradient field Gr and then applied in a pulse form at each switch of the polarity of the readout gradient field Gr with the polarity of the field Ge reversed. The interval when the readout gradient field Gr is applied with its polarity switched is a data observation interval Tobs.

The sequence of FIG. 1 is for the so-called full encode method by which, as illustrated in FIG. 2 which shows the manner of data acquisition on Fourier space (k-space), sequential encoding is performed to acquire all the data in phase space, or Fourier space utilizing information on both sides (before and after) of the center $2\tau$ of the spin echo.

As shown in FIG. 3, the ultra high speed Fourier method utilizing the so-called half-encoding method is different from the full-encoding method of FIG. 1 in that the readout gradient field Gr is reversed repeatedly only on one side of the spin echo center $2\tau'$ and the phase-encoding gradient field Ge is not reversed before the repeated switching of the readout gradient field Gr. In this case, though only data on the half plane of the Fourier space are acquired, data on the other half plane can be obtained by taking the complex conjugate of the acquired magnetic resonance data. For example, if the complex conjugate of data S(t) on the Fourier space is taken, then data $S(-t) = S^*(t)$ will be obtained. Here the reason why data are collected only on one side of the spin echo center $2\tau'$ is that, because data of a half plane are produced by taking the complex conjugate it is desired to collect central data of phase space at the spin echo center in which the inhomogeneity of the magnetic field is minimum.

With the echo planar method, on the other hand, the encoding gradient field Ge is applied statically and continuously during the interval in which the readout gradient field is switched repeatedly instead of being applied intermittently as shown in FIGS. 1 and 3. In this case, on the Fourier space, data acquisition is performed not in parallel with axis kx corresponding to the readout direction as in the cases of FIGS. 2 and 4 but in a zigzag.

According to those methods, image data of a slice can be acquired during a period of time the magnetization of spins in the slice excited by the 90° radio frequency pulse relaxes because of the relaxation phenomenon of transverse magnetization, thus permitting ultra high speed imaging.

However, the above ultra high speed imaging methods have the following problems.

Phase dispersion occurs with the excited spins within a slice because of spatial inhomogeneity of the static field and apparent transverse relaxation occurs during time T2* less than the transverse relaxation time T2. Accordingly, correct image reconstruction cannot be achieved because of the phase dispersion due to the influence of the inhomogeneity when the period of the data acquisition or the signal observation is long in comparison with the apparent transverse relaxation time T2. With pulse sequences for the ultra high speed imaging shown in FIGS. 1 and 3, after excitation of spins by a 90° selective excitation pulse, a 180° radio frequency pulse is applied to rephase the spins which have been dephased so that magnetic resonance data may be acquired. It should be noted that the data acquisition is not performed immediately after the application of the 90° selective excitation pulse. According to this approach, the 180° pulse is applied after a time of $\tau$ or $\tau'$ from when the 90° pulse is applied and the spins are rephased after a time of $\tau$ or $\tau'$ from when the 180° pulse is applied (this point corresponds to the spin echo center $2\tau$ or $2\tau'$). Thus, the observation time Tobs is set in the neighborhood of the time at which the spins are rephased. Artifacts will be produced when physiological motion of a subject under examination occurs during the observation interval Tobs. Hence, all the magnetic resonance data required for obtaining an image must be collected within a short length of time (for example, about 30 milliseconds) during which the spins have been rephased and the physiological motion of the subject has little influence.

In the above echo planar method and ultra high speed Fourier method, the gradient fields are switched at high speed to sample magnetic resonance data. However, the number of gradient echoes which are generated or available during such a short length of time as described above, namely, the number of encode steps has a limit because of limitations of switching speed of the gradient fields (for example, rising time of about 300 $\mu$s) and sampling speed. For example, in the case of FIG. 1 where both sides of the spin echo center $2\tau$ are utilized, the number of the gradient echoes is limited to about 64. Thus, high resolution in the encode direction is difficult to achieve. Where the half encode method is utilized, the high resolution is still difficult to achieve because data are collected on one side of the spin echo as described above.

SUMMARY OF THE INVENTION

As described above, with the existing ultra high speed imaging methods, the number of encode steps is limited because of a limit of all data acquisition time and limits of switching speed and sampling speed of gradient fields, thus making high resolution difficult.

It is accordingly an object of the present invention to provide a magnetic resonance imaging system which permits ultra high speed imaging at high resolution.

According to the magnetic resonance imaging system of the present invention, in order to improve resolution in the encoding direction, gradient echoes are produced on both sides of the spin echo center and at least one of an amount (an interval on Fourier space) and sequence of encoding steps is properly set so that all the multiecho data or their complex conjugate data correspond to data on a half plane of the Fourier space.

By taking the complex conjugate data of the magnetic resonance data collected in that way data are obtained over the entire phase space for image reconstruction.

With the magnetic resonance imaging system according to the present invention, a high-resolution magnetic resonance image can be obtained without prolongation of an entire imaging time.

BRIEF DESCRIPTION OF THE DRAWINGS

FIG. 5 is a block diagram of a magnetic resonance imaging system according to a first embodiment of the present invention;

FIG. 7 illustrates the manner of data acquisition on Fourier space in the first embodiment;

FIG. 10 illustrates the manner of data acquisition on Fourier space according to a further embodiment of the present invention.

DETAILED DESCRIPTION OF THE PREFERRED EMBODIMENTS

Figure 1:
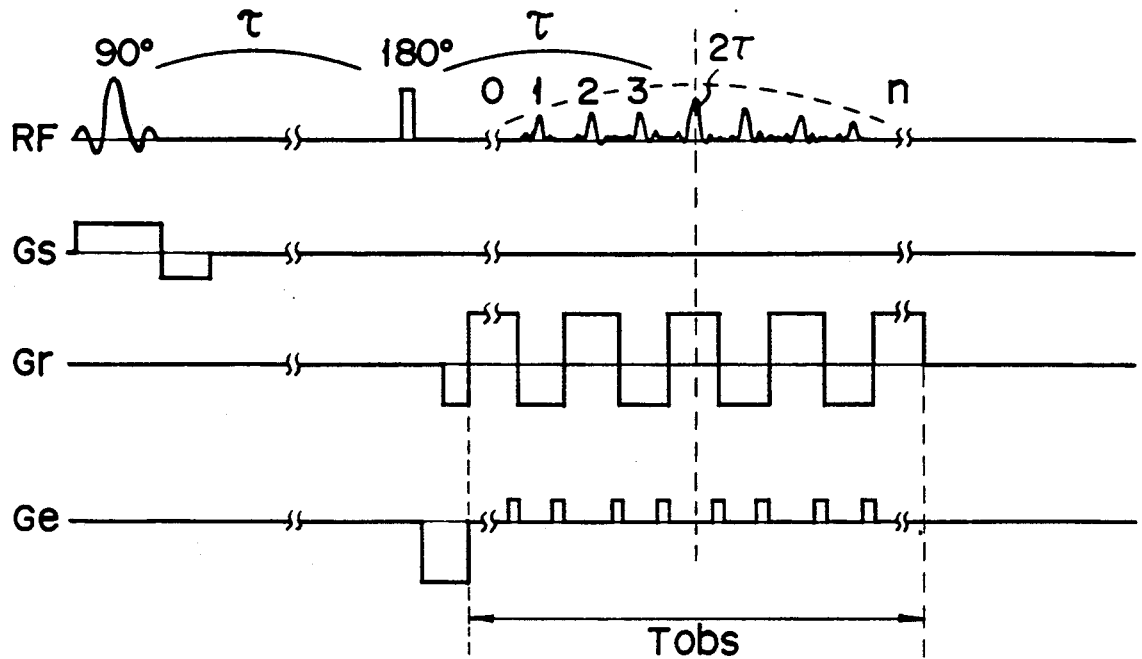
FIG. 1 illustrates an example of a pulse sequence in the ultra high speed Fourier method using an existing full encoding method.
Figure 3:
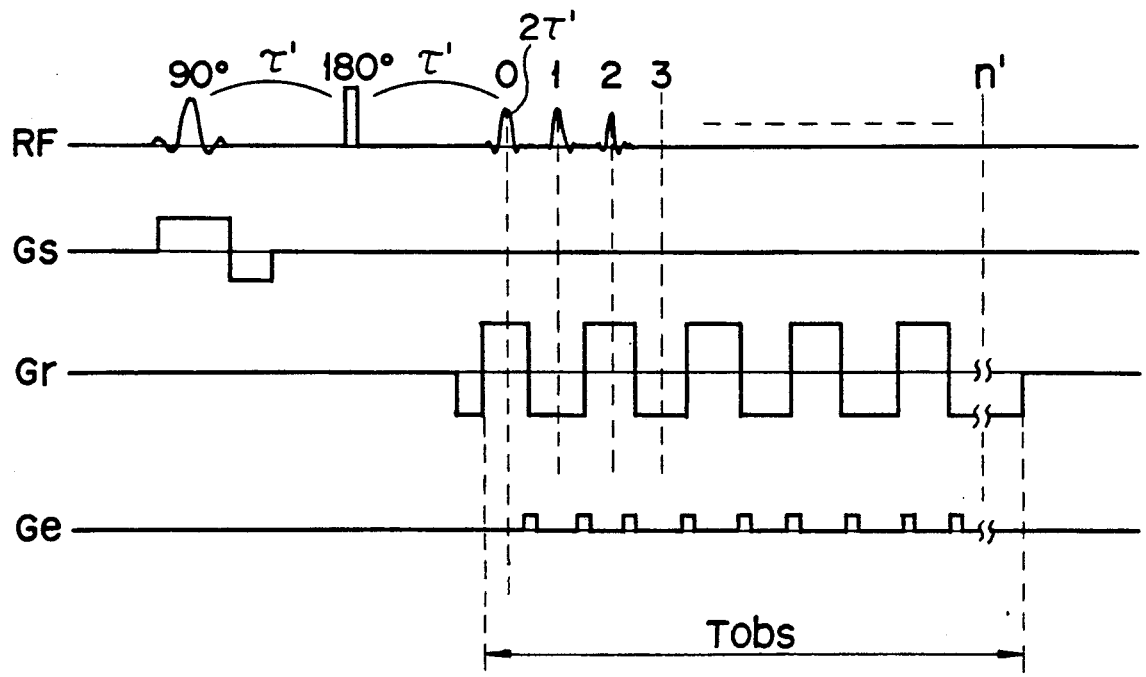
FIG. 3 illustrates an example of a pulse sequence in the ultra high speed Fourier method using an existing half encoding method.

Referring to FIG. 5, a static field magnet 1 and gradient coils 3 are driven by an exciting power supply 2 and a driver circuit 4, respectively. Exciting power supply 2 and driver circuit 4 are in turn driven by a system controller 10. Static field magnet 1 applies a uniform static field to an object under examination (for example, a human body) 5 placed on an examination couch 6. Gradient field coils 3 apply gradient fields to object 5, which vary in strength in three mutually orthogonal directions x, y and z. Directions x and y are mutually orthogonal directions in a cross section, or a slice plane, of interest of object, and direction z is perpendicular to the slice plane. In the present embodiment, the gradient field Gz applied in the z direction is termed as the slice-selection gradient field, the gradient field applied in the x direction as the readout gradient field Gr and the gradient field Gy applied in the y direction as the phase-encoding gradient field Ge.

Object 5 is further subject to a radio frequency field produced by a probe 7 supplied with a radio frequency signal from a transmitter 8 which also operates under the control of system controller 10. In the present embodiment, probe 7 is used as a transmitter coil adapted for generating the radio frequency field and a receiver coil adapted for receiving a magnetic resonance signal related to a specific atomic nucleus within object 5. Alternatively, a transmitter coil and a receiver coil may be provided separately.

Magnetic resonance signals, i.e., magnetic resonance echo signals received by probe 7 are amplified and detected by a receiver 9 and then transferred to a data collecting section 11. The data transfer is also performed under the control of system controller 10. Data collecting section 11, which is controlled by system controller 10, collects magnetic resonance echo signals supplied from receiver 11 and converts them to digital signals for transmission to a computer 12.

Computer 12 is operated by an operator through a console 13. Computer 12 performs Fourier transform on magnetic resonance echo data from data collecting section 11 for image reconstruction to obtain image data. Also, computer 12 controls system controller 10. The image data obtained by computer 12 is applied to an image display 14 for visual display.

Figure 6:
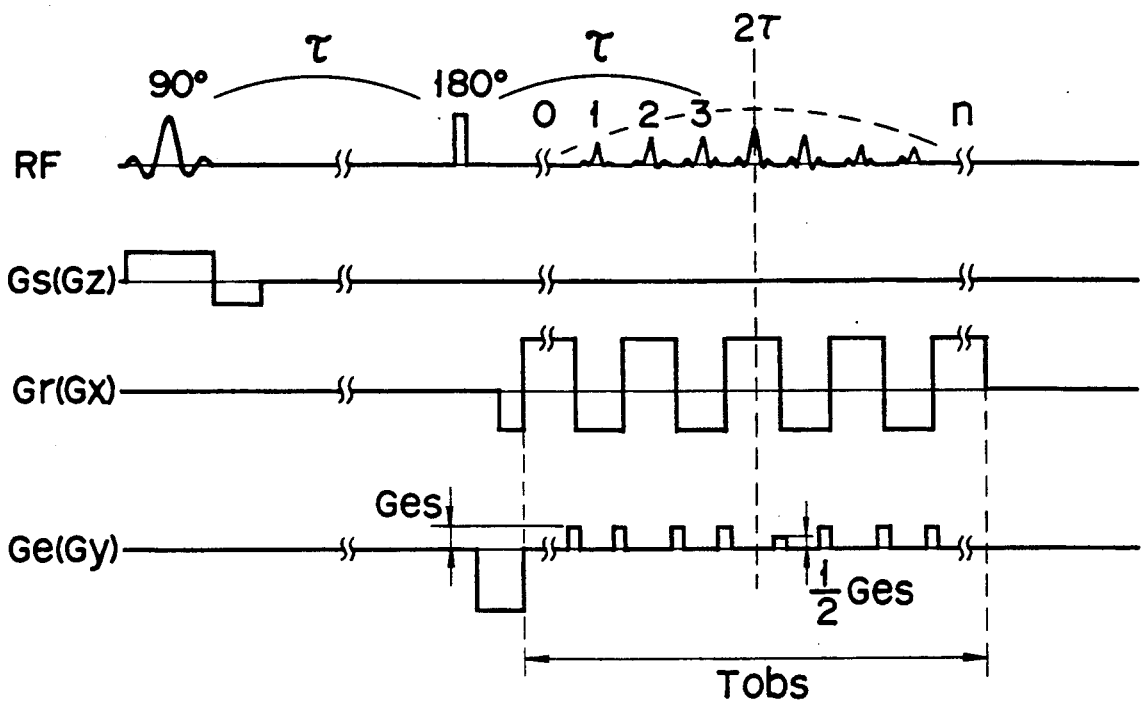
FIG. 6 illustrates a pulse sequence for acquiring magnetic resonance data in the first embodiment.

FIG. 6 illustrates one example of a pulse sequence for obtaining image data of a slice of object 5 according to the present invention. This pulse sequence is controlled by system controller 10.

The pulse sequence shown in FIG. 6 is a modification of the pulse sequence for the existing ultra high speed Fourier method shown in FIG. 1. The pulse sequence is different from that of FIG. 1 in that only the pulse for phase encoding gradient field Ge immediately after the spin echo center $2\tau$ has its amplitude or pulse height value reduced to one half of the pulse amplitude Ges of pulses for other phase encoding gradient fields Ge (but they are all the same in pulse width). The reason for the pulse for the phase encoding gradient field Ge immediately after the spin echo center 2τ to have a pulse amplitude of (½)Ges is to reduce the amount of encoding by that pulse to half of that by another pulse.

That is, to selectively excite spins within a slice of interest of object 5 first, slice-selection gradient field Gs in the z direction is applied by gradient field generating coils 3 driven by driver circuit 4 and a 90° selective excitation pulse (a radio frequency pulse for rotating, or "flipping", only the spins within a predetermined slice through 90°) is applied by probe 7 driven by transmitter 8. Thereby, predetermined nuclear spin-magnetization within the specific slice within object 5 is selectively excited to induce magnetic resonance. After the application of 90° selective excitation pulse the slice selection gradient field Gs is reversed to rephase the spins.

As described above, a 180° RF pulse is applied after time τ from the application of the 90° pulse and the slice selection gradient field Gs by probe 7. After the application of the 180° pulse, the x-direction readout gradient field Gr and the y-direction phase-encoding gradient field Ge are applied by gradient field coils 3 to cause 0 to n-th magnetic resonance echoes in sequence. That is, with the x-direction readout gradient field Gr applied repeatedly switched in its polarity, the y-direction phase-encoding gradient field Ge is applied in pulse form at each switch of the direction of the readout gradient field Gr. It is to be noted here that immediately before the switching of the polarity of the readout gradient field Gr the phase encoding gradient field Ge is applied in the opposite polarity to the polarity when it is applied in pulse form. And, as described above, the pulse amplitude of the phase encoding gradient field Ge immediately after the spin echo center 2τ is set to one half of that of the other phase encoding gradient fields Ge. In this way, 0 to n-th magnetic resonance signals from object 5 are collected by data collecting section 11 through probe 7 and receiver 9 and then transferred to computer 12. By obtaining complex conjugate data of the magnetic resonance data obtained from the echo signals and then Fourier transforming both the data for image reconstruction, image data of the slice is produced.

Figure 2:
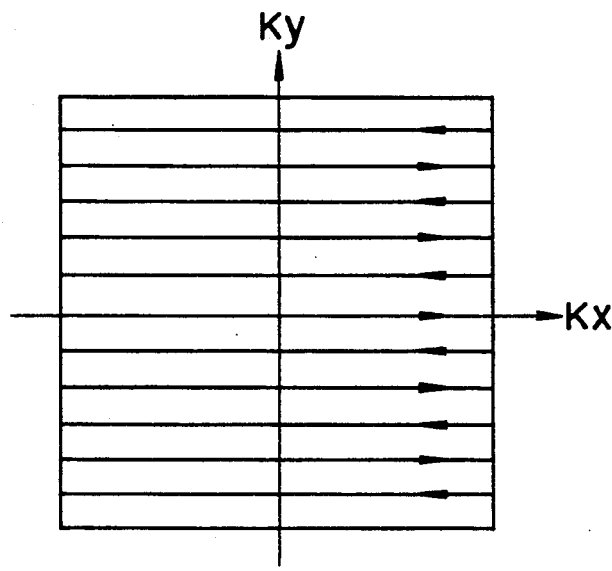
FIG. 2 illustrates the manner of data acquisition using the pulse sequence of FIG. 1 on Fourier space.
Figure 4:
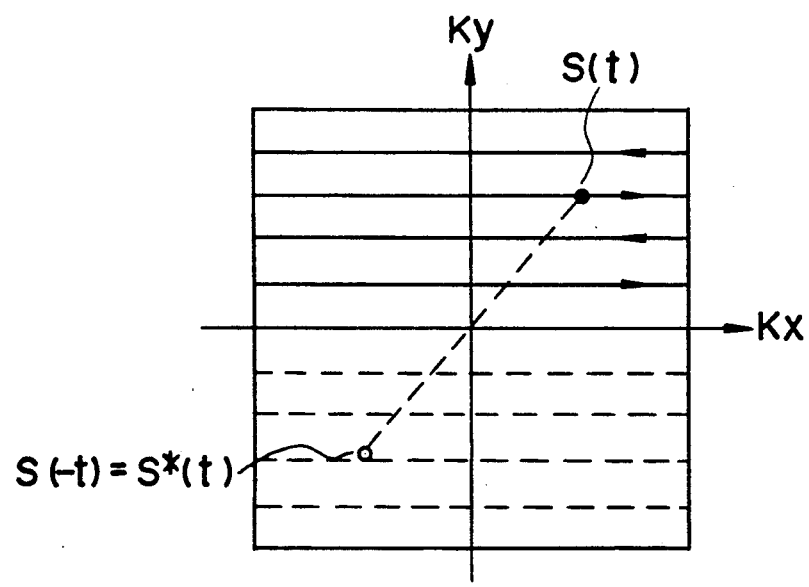
FIG. 4 illustrates the manner of data acquisition using the pulse sequence of FIG. 3 on Fourier space.

The image data collected at this point have such a positional relationship as shown by solid lines in FIG. 7 on the Fourier space. That is, data are collected by the normal encoding steps as in the case of FIG. 2 in a region in which the ky coordinate is negative with respect to axis kx, and data are collected with the half encoding step (having one half of the amount of encoding in the normal encoding steps) only immediately after zero encode data (data whose encode amount is zero) on axis kx are collected. Subsequently data are collected by the normal encode steps. By taking the complex ky coordinate is negative with respect to axis kx, data as shown by broken lines, i.e., intermediate data of data collected in the region in which the ky coordinate is positive with respect to axis kx are obtained. Likewise, by taking the complex conjugate of data collected in the region in which the ky coordinate is positive with respect to kx, intermediate data of data collected in the region in which the ky coordinate is negative with respect to kx. By taking the complex conjugate of collected magnetic resonance data as direction can be doubled. Even in this case, a time required to collect magnetic resonance data is the same as that required in the case of the pulse sequence of FIG. 1.

It is to be noted that, in the pulse sequence of FIG. 6, the reason why the pulse amplitude of the phase encoding gradient field Ge immediately after the spin echo center 2τ is set to (½)Ges is to reduce the amount of encoding to one half of the other portions. To halve the amount of encoding it is only required that the area of the pulse waveform be halved. Hence, the pulse width may be halved with the same pulse height instead of varying the pulse amplitude.

Figure 8:
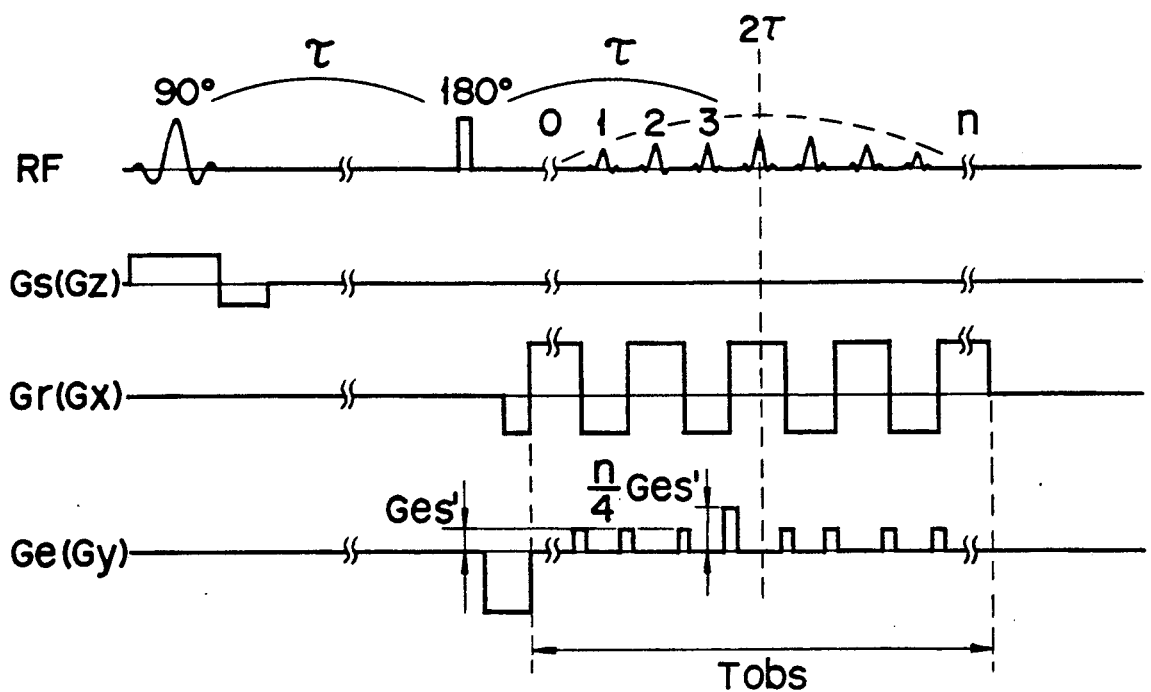
FIG. 8 illustrates a pulse sequence for acquiring magnetic resonance data in a magnetic resonance system according to a second embodiment of the present invention.

A pulse sequence of a second embodiment of the present invention is illustrated in FIG. 8.

The pulse sequence of FIG. 8 is different from that of FIG. 6 in that the pulse amplitude Ges' of the repetitive pulses for the phase encoding gradient field Ge is set to, for example, one half of the amplitude Ges of FIG. 6 and the pulse amplitude of the phase encoding gradient field Ge pulse immediately before the spin echo center SE is set to (n/4)Ges'.

Figure 9:
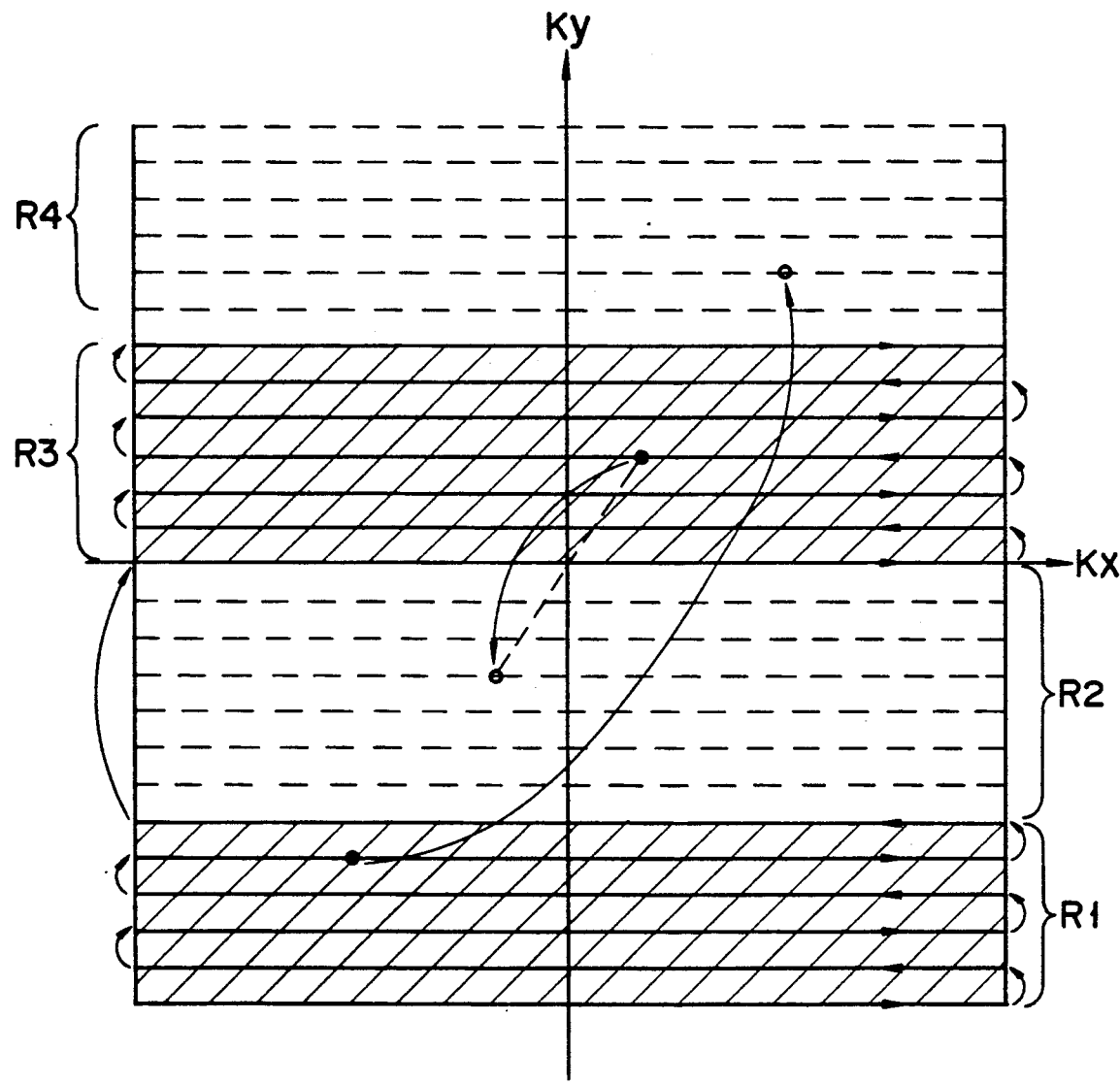
FIG. 9 illustrates the manner of data acquisition on Fourier space in the second embodiment.

In the second embodiment, as shown in FIG. 9, after magnetic resonance data of a region R1 on Fourier space have been collected, a region R2 on Fourier space is skipped by the phase encoding gradient field Ge of amplitude (n/4)Ges' to collect magnetic resonance data of a region R3 on Fourier space. Data of a region R4 are obtained by taking the complex conjugate of the collected magnetic resonance data of region R1 and data of region R2 are obtained by taking the complex conjugate of the collected magnetic resonance data of R3. In this way data of the whole Fourier space are obtained at the same density as in the case of the FIG. 1 embodiment for subsequent image reconstruction.

The present invention is not limited to the above embodiments.

For example, in the above first and second embodiments, a description is given of a case where the present invention is carried out in accordance with the pulse sequences corresponding to the ultra high speed Fourier method. Alternatively, a pulse sequence corresponding to the echo planar method may be applied to the present invention. In this case it is only required that the amplitude of the phase encoding gradient field Ge, which is applied continuously and statically during data observation interval Tobs, be varied in pulse form immediately after or before the spin echo.

In the above embodiments, substantially high density data are obtained for the whole region of Fourier transform. Alternatively, high density data may be obtained only for a part of the Fourier space, for example, the vicinity of zero encode data as shown in FIG. 10. In this case, parts in which data are dropped out are filled with zero values.

Although specific embodiments of the present invention have been disclosed and described, it is apparent that other embodiments and modifications of the invention are possible.

What is claimed is:

1. A magnetic resonance imaging system for applying a radio frequency magnetic field and gradient magnetic fields to an object under examination placed in a uniform static magnetic field, in accordance with a predetermined pulse sequence, and detecting magnetic resonance signals resulting from magnetic resonance induced within the object for imaging, said imaging system comprising:

pulse generating means for generating a first radio frequency pulse and a second radio frequency pulse following the first radio frequency pulse, for producing the radio frequency magnetic field;

data collecting means for collecting all the data required for image reconstruction of a predetermined portion of the object under examination, by means of one excitation process in accordance with a pulse sequence in which, after excitation of spins within the predetermined portion by the radio frequency magnetic field and a gradient magnetic field, a predetermined readout gradient magnetic field is applied and switched positive and negative at high speed to produce multiechoes on both sides of a spin echo center and a predetermined phase encoding gradient magnetic field is applied whose amount and sequence in encode steps are controlled so that one of multiecho data and its complex conjugate data may scan substantially half of the Fourier data plane and the spin echo center is positioned at the center of the Fourier data plane; and image processing means for obtaining the complex conjugate data from the magnetic resonance data collected by said collecting means and two-dimensional-complex-Fourier-transforming the magnetic resonance data and the complex conjugate data, to obtain magnetic resonance image data on the predetermined portion of the object under examination.

2. A magnetic resonance imaging system for applying a radio frequency magnetic field and gradient magnetic fields to an object under examination placed in a uniform static magnetic field in accordance with a predetermined pulse sequence and detecting magnetic resonance signals resulting from magnetic resonance induced within the object for imaging, comprising:

data collecting means for collecting all the data required for image reconstruction of a predetermined portion of the object under examination, by means of one excitation process in accordance with a pulse sequence in which, after excitation of spins within the predetermined portion by the radio frequency magnetic field and a gradient magnetic field, a predetermined readout gradient magnetic field is applied and switched positive and negative at high speed to produce multiechoes on both sides of a spin echo center and a predetermined phase encoding gradient magnetic field is applied whose amount and sequence in encode steps are controlled so that one of multiecho data and its complex conjugate data may scan substantially half of the Fourier data plane; and image processing means for obtaining the complex conjugate data from the magnetic resonance data collected by said collecting means and two-dimensional-complex-Fourier-transforming the magnetic resonance data and the complex conjugate data, to obtain magnetic resonance image data of the predetermined portion of the object under examination;

wherein said data collecting means sets encode steps such that, on the Fourier data plane, an amount of encoding of the encode step next to zero encode data corresponding to the spin echo center is one half of that of other encode steps.

3. A system according to claim 1 in which said data collecting means collects magnetic resonance data so that multiecho data on both sides of the spin echo center are asymmetric with respect to the spin echo on the Fourier data plane.

4. A magnetic resonance imaging system for applying a radio frequency magnetic field and gradient magnetic fields to an object under examination placed in a uniform static magnetic field in accordance with a predetermined pulse sequence and detecting magnetic resonance signals resulting from magnetic resonance induced within the object for imaging, comprising:

data collecting means for collecting all the data required for image reconstruction of a predetermined portion of the object under examination, by means of one excitation process in accordance with a pulse sequence in which, after excitation of spins within the predetermined portion by the radio frequency magnetic field and a gradient magnetic field, a predetermined readout gradient magnetic field is applied and switched positive and negative at high speed to produce multiechoes on both sides of a spin echo center and a predetermined phase encoding gradient magnetic field is applied whose amount and sequence in encode steps are controlled so that one of multiecho data and its complex conjugate data may scan substantially half of the Fourier data plane; and image processing means for obtaining the complex conjugate data from the magnetic resonance data collected by said collecting means and two-dimensional-complex-Fourier-transforming the magnetic resonance data and the complex conjugate data, to obtain magnetic resonance image data of the predetermined portion of the object under examination;

wherein said data collecting means sets encode steps such that part of encode steps of magnetic resonance data on the Fourier data plane is one half of the other encode steps.

5. A system according to claim 1 in which said data collecting means collects all data required for image reconstruction of the slice in accordance with a pulse sequence in which a slice selection gradient magnetic field in the direction orthogonal to the slice and a 90° radio frequency pulse for exciting spins are applied to the slice to induce magnetic resonance therein, a readout gradient magnetic field in the direction orthogonal to the slice selection gradient and negative at a high speed after application of a 180° radio frequency pulse and a phase encoding gradient magnetic field in the direction orthogonal to the slice selection gradient magnetic field and the readout gradient magnetic field are applied in encode steps.

6. A magnetic resonance imaging system for applying a radio frequency magnetic field and gradient magnetic fields to an object under examination placed in a uniform static magnetic field in accordance with a predetermined pulse sequence and detecting magnetic resonance signals resulting from magnetic resonance induced within the object for imaging, comprising:

data collecting means for collecting all the data required for image reconstruction of a predetermined portion of the object under examination, by means of one excitation process in accordance with a pulse sequence in which, after excitation of spins within the predetermined portion by the radio frequency magnetic field and a gradient magnetic field, a predetermined readout gradient magnetic field is applied and switched positive and negative at high speed to produce multiechoes on both sides of a spin echo center and a predetermined phase encoding gradient magnetic field is applied whose amount and sequence in encode steps are controlled so that one of multiecho data and its complex conjugate data may scan substantially half of the Fourier data plane; and image processing means for obtaining the complex conjugate data from the magnetic resonance data collected by said collecting means and two-dimensional-complex-Fourier-transforming the magnetic resonance data and the complex conjugate data, to obtain magnetic resonance image data of the predetermined portion of the object under examination;

wherein said data collecting means collects magnetic resonance data on sides of the spin echo center and in the vicinity thereof, and said image processing means includes means for zero-filling parts of the Fourier data plane which lack magnetic resonance data and its complex conjugate data.

7. A magnetic resonance imaging system comprising:

static magnetic field applying means for generating a uniform static magnetic field for application to an object under examination;

gradient magnetic field applying means for generating gradient magnetic fields for application to the object;

transmitter and receiver means for transmitting a radio frequency magnetic field for application to the object and receiving magnetic resonance signals induced within the object, comprising pulse generating means for generating a first radio frequency pulse and a second radio frequency pulse following the first radio frequency pulse, for producing the radio frequency magnetic field;

data collect control means for controlling said static magnetic field applying means, said gradient magnetic field applying means and said transmitter and receiver means so as to apply a radio frequency magnetic field and gradient magnetic fields to the object placed in the uniform static magnetic field to induce magnetic resonance within a predetermined portion of the object and detecting magnetic resonance signals resulting from the magnetic resonance; and image processing means for processing collecting magnetic resonance signals to obtain a magnetic resonance image of the predetermined portion of the object, said data collect control means including data collecting means for collecting all the data required for image reconstruction of the predetermined portion of the object under examination, by means of one excitation process in accordance with a pulse sequence in which, after excitation of spins within the predetermined portion by the radio frequency field and a gradient field, a predetermined readout gradient field is applied while being switched positive and negative at high speed to produce multiechoes on both sides of a spin echo center and a predetermined phase encoding gradient field is applied whose amount and sequence in encode steps are controlled so that multiecho data scans substantially half of the Fourier data plane and the spin echo center is positioned at the center of the Fourier data plane, said image processing means including means for obtaining the complex conjugate of magnetic resonance data collected by said data collecting means and two-dimensional-complex-Fourier-transforming the magnetic resonance data and the complex conjugate data to obtain magnetic resonance image data, of the predetermined portion of the object under examination.

8. A magnetic resonance imaging system comprising:

static magnetic field applying means for generating a uniform static magnetic field for application to an object under examination;

gradient magnetic field applying means for generating gradient magnetic fields for application to the object;

transmitter and receiver means for transmitting a radio frequency magnetic field for application to the object and receiving magnetic resonance signals induced within the object;

data collect control means for controlling said static magnetic field applying means, said gradient magnetic field applying means and said transmitter and receiver means so as to apply a radio frequency magnetic field and gradient magnetic fields to the object placed in the uniform static magnetic field to induce magnetic resonance within a predetermined portion of the object and detecting magnetic resonance signals resulting from the magnetic resonance; and image processing means for processing collected magnetic resonance signals to obtain a magnetic resonance image of the predetermined portion of the object, said data collect control means including data collecting means for collecting all the data required for image reconstruction of the predetermined portion of the object under examination by means of one excitation process in accordance with a pulse sequence in which, after excitation of spins within the predetermined portion by the radio frequency field and a gradient field, a predetermined readout gradient field is applied while being switched positive and negative at high speed to produce multiechoes on both sides of a spin echo center and a predetermined phase encoding gradient field is applied whose amount and sequence in encode steps are controlled so that multiecho data scans substantially the half of a Fourier plane, said image processing means including means for obtaining the complex conjugate of magnetic resonance data collected by said data collecting means and two-dimensional-complex-Fourier-transforming the magnetic resonance data and the complex conjugate data to obtain magnetic resonance image data of the predetermined portion of the object under examination;

wherein said data collecting means sets encode steps such that, on the Fourier data plane, an amount of encoding of the encode step next to zero encode data corresponding to the spin echo center is one half of that of other encode steps.

9. A system according to claim 7 in which said data collecting means collects magnetic resonance data so that multiecho data on both sides of the spin echo center are asymmetric with respect to the spin echo on the Fourier data plane.

10. A magnetic resonance imaging system comprising:

static magnetic field applying means for generating a uniform static magnetic field for application to an object under examination;

gradient magnetic field applying means for generating gradient magnetic fields for application to the object;

transmitter and receiver means for transmitting a radio frequency magnetic field for application to the object and receiving magnetic resonance signals induced within the object;

data collect control means for controlling said static magnetic field applying means, said gradient magnetic field applying means and said transmitter and receiver means so as to apply a radio frequency magnetic field and gradient magnetic fields to the object placed in the uniform static magnetic field to induce magnetic resonance within a predetermined portion of the object and detecting magnetic resonance signals resulting from the magnetic resonance; and imaging processing means for processing collected magnetic resonance signals to obtain a magnetic resonance image of the predetermined portion of the object, said data collect control means including data collecting means for collecting all the data required for image reconstruction of the predetermined portion of the object under examination by means of one excitation process in accordance with a pulse sequence in which, after excitation of spins within the predetermined portion by the radio frequency field and a gradient field, a predetermined readout gradient field is applied while being switched positive and negative at high speed to produce multiechoes on both sides of a spin echo center and a predetermined phase encoding gradient field is applied whose amount and sequence in encode steps are controlled so that multiecho data scans substantially the half of a Fourier data plane, said image processing means including means for obtaining the complex conjugate of magnetic resonance data collected by said data collecting means and two-dimensional-complex-Fourier-transforming the magnetic resonance data and the complex conjugate data to obtain magnetic resonance image data of the predetermined portion of the object under examination;

wherein said data collecting means sets encode steps such that part of encode steps of magnetic resonance data on the Fourier data plane is one half of the other encode steps.

11. A system according to claim 7 in which said data collecting means collects all data required for image reconstruction of the slice in accordance with a pulse sequence in which a slice selection gradient magnetic field in the direction orthogonal to the slice and a 90° radio frequency pulse for exciting spins are applied to the slice to induce magnetic resonance therein, a readout gradient magnetic field in the direction orthogonal to the slice selecting gradient magnetic field is applied while being switched positive and negative at a high speed after application of a 180° radio frequency pulse and a phase encoding gradient magnetic field in the direction orthogonal to the slice selection gradient magnetic field and the readout gradient magnetic field are applied in accordance with amounts and a sequence of predetermined encode steps.

12. A magnetic resonance imaging system comprising:

static magnetic field applying means for generating a uniform static magnetic field for application to an object under examination;

gradient magnetic field applying means for generating gradient magnetic fields for application to the object;

transmitter and receiver means for transmitting a radio frequency magnetic field for application to the object and receiving magnetic resonance signals induced within the object;

data collect control means for controlling said static magnetic field applying means, said gradient magnetic field applying means and said transmitter and receiver means so as to apply a radio frequency magnetic field and gradient magnetic fields to the object placed in the uniform static magnetic field to induce magnetic resonance within a predetermined portion of the object and detecting magnetic resonance signals resulting from the magnetic resonance; and image processing means for processing collected magnetic resonance signals to obtain a magnetic resonance image of the predetermined portion of the object, said data collect control means including data collecting means for collecting all the data required for image reconstruction of the predetermined portion of the object under examination by means of one excitation process in accordance with a pulse sequence in which, after excitation of spins within the predetermined portion by the radio frequency field and a gradient field, a predetermined readout gradient field is applied while being switched positive and negative at high speed to produce multiechoes on both sides of a spin echo center and a predetermined phase encoding gradient field is applied whose amount and sequence in encode steps are controlled so that multiecho data scans substantially the half of a Fourier data plane, said image processing means including means for obtaining the complex conjugate of magnetic resonance data collected by said data collecting means and two-dimensional-complex-Fourier-transforming the magnetic resonance data and the complex conjugate data to obtain magnetic resonance image data of the predetermined portion of the object under examination;

wherein said data collecting means collects magnetic resonance data only on both sides of the spin echo center and in the vicinity thereof, and said image processing means includes means for zero-filling parts of the Fourier data plane which lack magnetic resonance data and its complex conjugate data.

* * * * *